(12) United States Patent
Sotome et al.

(10) Patent No.: US 10,985,634 B2
(45) Date of Patent: Apr. 20, 2021

(54) INVERTER-INTEGRATED ROTATING ELECTRIC MACHINE

(71) Applicant: Mitsubishi Electric Corporation, Tokyo (JP)

(72) Inventors: Hideyuki Sotome, Tokyo (JP); Kazuma Fujiwara, Tokyo (JP); Satoshi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/603,629

(22) PCT Filed: Apr. 26, 2017

(86) PCT No.: PCT/JP2017/016507
§ 371 (c)(1),
(2) Date: Oct. 8, 2019

(87) PCT Pub. No.: WO2018/198219
PCT Pub. Date: Nov. 1, 2018

(65) Prior Publication Data
US 2020/0120786 A1    Apr. 16, 2020

(51) Int. Cl.
*H05K 1/02* (2006.01)
*H02K 11/01* (2016.01)
(Continued)

(52) U.S. Cl.
CPC .......... *H02K 11/0141* (2020.08); *H02K 9/00* (2013.01); *H02K 11/33* (2016.01); *H02P 11/00* (2013.01); *H05K 1/021* (2013.01)

(58) Field of Classification Search
CPC ........ H05K 1/021; H02K 11/33; H02K 9/005; H02K 9/22; H02K 11/01; H02K 11/30; H02P 11/00; H02M 7/48
See application file for complete search history.

(56) References Cited

U.S. PATENT DOCUMENTS

| 5,724,234 A * | 3/1998 | Phelps | H05K 9/0026 |
| | | | 174/357 |
| 7,371,977 B1 * | 5/2008 | Preonas | H05K 9/0041 |
| | | | 174/383 |

(Continued)

FOREIGN PATENT DOCUMENTS

JP    10-270609 A    10/1998
JP    2003-324903 A    11/2003
(Continued)

OTHER PUBLICATIONS

Denso Corp, Toyota, Multi-phase inverter module, Feb. 5, 2004 (Year: 2004).*

(Continued)

*Primary Examiner* — Steven T Sawyer
(74) *Attorney, Agent, or Firm* — Sughrue Mion, PLLC; Richard C. Turner (57) ABSTRACT

Provided is an inverter-integrated rotating electric machine capable of suppressing an influence of electromagnetic noise between a peripheral device and a control circuit board. An inverter-integrated rotating electric machine (1A) includes: a rotating electric machine main body (2); and an inverter device (3A), which is provided to the rotating electric machine main body (2). The inverter device (3A) includes: a heat sink (32) configured to cool switching elements (31); a control circuit board (33), which is provided so as to be opposed to the heat sink (32), and includes a drive circuit configured to drive the switching elements (31); and a metal shield plate (34), which is provided so as to be opposed to the control circuit board (33) in such a manner that the control circuit board (33) is arranged between the metal shield plate (34) and the heat sink (32), and is electrically connected to the heat sink (32).

11 Claims, 5 Drawing Sheets

(51) Int. Cl.
*H02K 11/33* (2016.01)
*H02P 11/00* (2006.01)
*H02K 9/00* (2006.01)

(56) References Cited

U.S. PATENT DOCUMENTS

| | | | |
|---|---|---|---|
| 2002/0025265 A1* | 2/2002 | Ikeda | F04C 29/045 |
| | | | 417/410.1 |
| 2003/0200761 A1 | 10/2003 | Funahashi et al. | |
| 2007/0176281 A1* | 8/2007 | Kim | H01L 24/97 |
| | | | 257/700 |
| 2010/0143165 A1 | 6/2010 | Itabashi et al. | |
| 2011/0211980 A1* | 9/2011 | Shibuya | H05K 7/1432 |
| | | | 417/410.1 |
| 2013/0320792 A1* | 12/2013 | Fukasaku | H02K 11/022 |
| | | | 310/89 |
| 2016/0254723 A1 | 9/2016 | Suzuki et al. | |

FOREIGN PATENT DOCUMENTS

| | | |
|---|---|---|
| JP | 2004-039749 A | 2/2004 |
| JP | 2008-202564 A | 9/2008 |
| JP | 2009-156213 A | 7/2009 |
| JP | 2016-160802 A | 9/2016 |
| JP | 2017-011783 A | 1/2017 |

OTHER PUBLICATIONS

International Search Report for PCT/JP2017/016507, dated Jul. 4, 2017.

Communication dated Mar. 17, 2020, from the European Patent Office in application No. 17907124.6.

* cited by examiner

ABSTRACT

INVERTER-INTEGRATED ROTATING ELECTRIC MACHINE

CROSS REFERENCE TO RELATED APPLICATIONS

This application is a National Stage of International Application No. PCT/JP2017/016507 filed Apr. 26, 2017.

TECHNICAL FIELD

The present invention relates to an inverter-integrated rotating electric machine including, for example, a rotating electric machine configured to transmit and receive motive power to and from an internal combustion engine.

BACKGROUND ART

Hitherto, there is known an inverter-integrated rotating electric machine having the following configuration (see, for example, Patent Literature 1). Specifically, the inverter-integrated rotating electric machine includes a motor and an inverter device, which is provided to the motor, and is configured to transmit and receive an electric power to and from the motor. The inverter device includes a power-system metal board, a control circuit board, and a metal shield plate. The power-system metal board is provided so as to be held in contact with a housing of the motor, and includes switching elements mounted thereto. The control circuit board is provided so as to be opposed to the power-system metal board. The metal shield plate is provided between the power-system metal board and the control circuit board.

CITATION LIST

Patent Literature

[PTL 1] JP 2009-156213 A

SUMMARY OF INVENTION

Technical Problem

However, there is a problem in that electromagnetic noise emitted from a peripheral device for the inverter-integrated rotating electric machine is received by the control circuit board and electromagnetic noise emitted from the control circuit board is received by the peripheral device.

The present invention has been made to solve the problem described above, and has an object to provide an inverter-integrated rotating electric machine capable of suppressing an influence of electromagnetic noise between a peripheral device and a control circuit board.

Solution to Problem

According to one embodiment of the present invention, there is provided an inverter-integrated rotating electric machine, including: a rotating electric machine main body; and an inverter device, which is provided to the rotating electric machine main body, and is configured to transmit and receive electric power to and from the rotating electric machine main body, wherein the inverter device includes: a heat sink configured to cool switching elements; a control circuit board, which is provided so as to be opposed to the heat sink, and includes a drive circuit configured to drive the switching elements; and a metal shield plate, which is provided so as to be opposed to the control circuit board in such a manner that the control circuit board is arranged between the metal shield plate and the heat sink, and is electrically connected to the heat sink.

Advantageous Effects of Invention

With the inverter-integrated rotating electric machine according to one embodiment of the present invention, the control circuit board is provided between the heat sink and the metal shield plate. Thus, the influence of the electromagnetic noise between the peripheral device for the inverter-integrated rotating electric machine and the control circuit board can be suppressed.

DESCRIPTION OF EMBODIMENTS

Hereinafter, preferred embodiments of the present invention are described in detail with reference to the drawings. The embodiments of the present invention are not limited to the embodiments exemplified below.

First Embodiment

Figure 1:
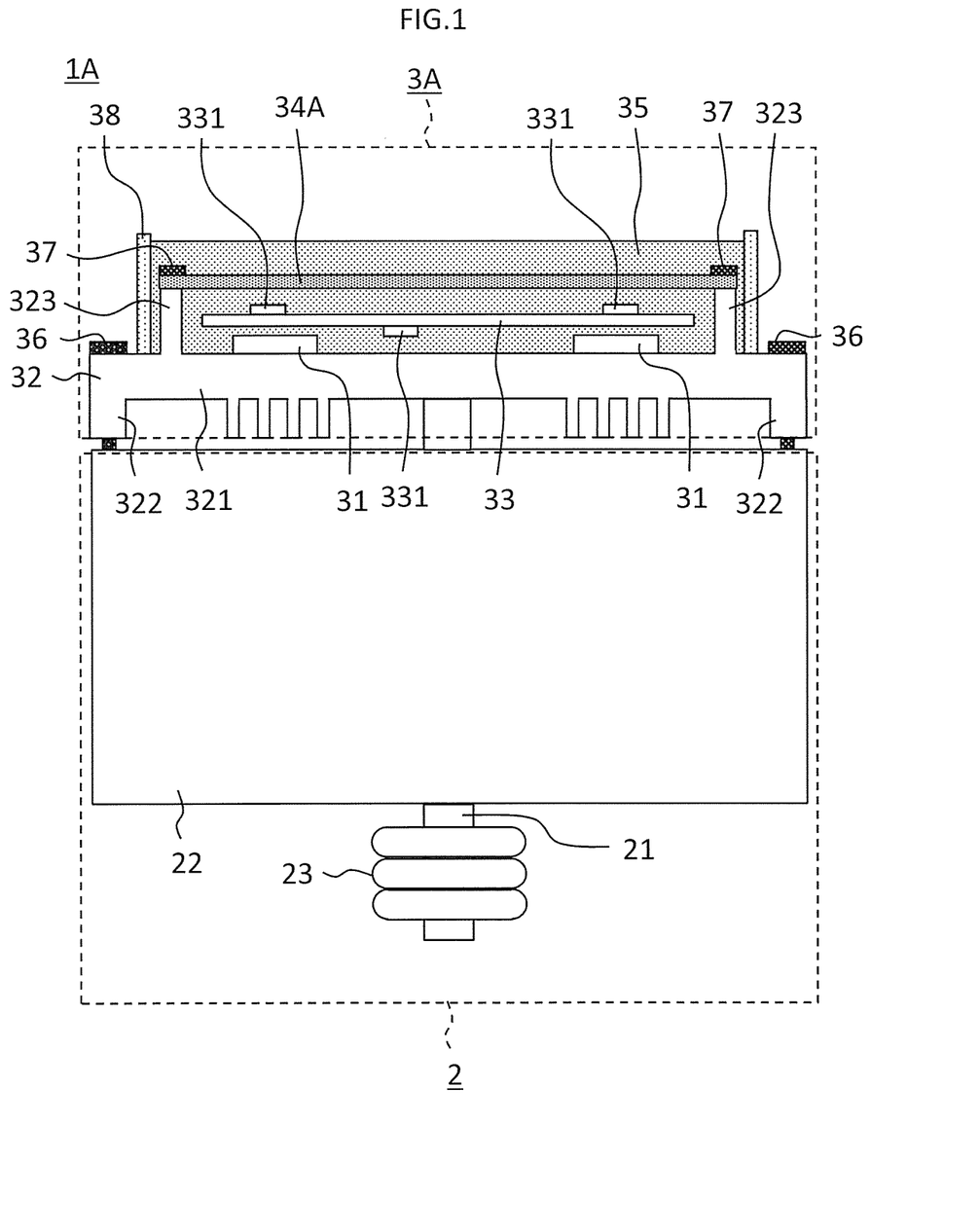
FIG. 1 is a configuration view for illustrating an inverter-integrated rotating electric machine according to a first embodiment of the present invention.

FIG. 1 is a configuration view for illustrating an inverter-integrated rotating electric machine according to a first embodiment of the present invention. An inverter-integrated rotating electric machine 1A includes a rotating electric machine main body 2 and an inverter device 3A provided to the rotating electric machine main body 2.

The rotating electric machine main body 2 includes a shaft 21, a bracket 22, and a pulley 23. The bracket 22 is configured to rotatably support the shaft 21. The pulley 23 is fixed to one end of the shaft 21 and is configured to rotate together with the shaft 21. A torque transmission belt (not shown) is mounted around the pulley 23. An internal combustion engine (not shown) is connected to the torque transmission belt. The rotating electric machine main body 2 is configured to transmit and receive motive power to and from the internal combustion engine through intermediation of the torque transmission belt.

The inverter device 3A includes a plurality of switching elements 31, a heat sink 32, a control circuit board 33, a metal shield plate 34A, and a resin portion 35. The heat sink 32 is configured to cool the switching elements 31. The control circuit board 33 is provided so as to be opposed to the heat sink 32. The metal shield plate 34A is provided so as to be opposed to the control circuit board 33 in such a manner that the control circuit board 33 is arranged between the metal shield plate 34A and the heat sink 32, and is electrically connected to the heat sink 32. The resin portion 35 is formed between the switching elements 31 and the control circuit board 33 and between the control circuit board 33 and the metal shield plate 34A.

The switching elements 31 are formed of MOSFETs. The switching elements 31 are not limited to the MOSFETs, and may be other switching elements. The plurality of switching elements 31 are connected to each other so as to form a three-phase bridge circuit.

The heat sink 32 is arranged so as to be opposed to the bracket 22 of the rotating electric machine main body 2. The heat sink 32 includes a heat sink main body 321, projecting portions 322, and projecting portions 323. The projecting portions 322 are formed at a peripheral edge of the heat sink main body 321 so as to project from the heat sink main body 321 toward the bracket 22. The projecting portions 323 project from the heat main body 321 toward the metal shield plate 34A. The projecting portions 323 are arranged on an inner side of the projecting portions 322 in an in-plane direction. A water passage or an air passage is formed in the heat sink main body 321. The switching elements 31 are held in surface contact with a surface of the heat sink main body 321, which is on the side opposite to a surface opposed to the bracket 22. The switching elements 31 are cooled with use of the water passage or the air passage of the heat sink main body 321. The heat sink 32 is of water-cooled type or air-cooled type.

The control circuit board 33 includes a drive circuit and an electric power generation circuit. The drive circuit is configured to drive the switching elements 31. The electric power generation circuit is configured to operate a CPU and the drive circuit. Each of the drive circuit and the electric power generation circuit includes a plurality of electronic components 331. The control circuit board 33 is surrounded by the projecting portions 323 of the heat sink 32 in the in-plane direction.

Examples of a resin for forming the resin portion 35 include, for example, an epoxy resin and a gel-like resin.

The inverter-integrated rotating electric machine 1A further includes a plurality of screws 36 and a plurality of screws 37. The plurality of screws 36 are configured to fix the heat sink 32 to the bracket 22 of the rotating electric machine main body 2. The plurality of screws 37 are configured to fix the metal shield plate 34A to the heat sink 32. The screws 36 and the screws 37 are made of an electroconductive material. Thus, the heat sink 32 and the bracket 22 of the rotating electric machine 2 are electrically connected to each other, and the metal shield plate 34A and the heat sink 32 are electrically connected to each other.

The inverter-integrated rotating electric machine 1A further includes a case 38 configured to surround the switching elements 31, the control circuit board 33, the metal shield plate 34A, and the resin portion 35 in the in-plane direction. The case 38 is made of a resin. The resin portion 35 is formed by causing a liquid resin to flow into the case 38. As a result of the formation of the resin portion 35 inside the case 38, reliability in terms of anti-vibration, water-proofness, and dust-proofness for the switching elements 31 and the control circuit board 33 is improved.

Figure 2:
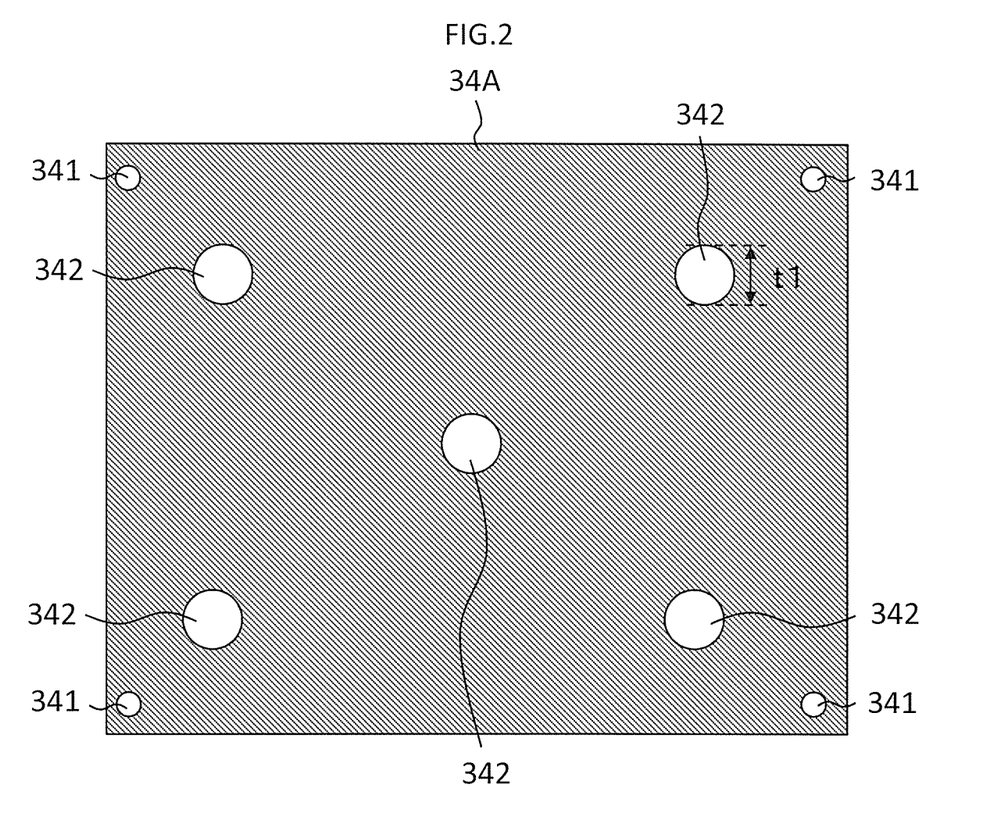
FIG. 2 is a plan view for illustrating a metal shield plate of FIG. 1.

FIG. 2 is a plan view for illustrating the metal shield plate 34A of FIG. 1. The metal shield plate 34A has a plurality of through holes 341 and a plurality of through holes 342. The screws 37 are inserted into the through holes 341. The liquid resin is caused to flow into the through holes 342. The through holes 341 and the through holes 342 pass through the metal shield plate 34A in a plate thickness direction of the metal shield plate 34A. The metal shield plate 34A is formed of an electroconductive plate such as a copper plate, an aluminum plate, or an iron plate. A radial dimension of each of the through holes 341 is smaller than a radial dimension of each of the through holes 342. The radial direction of each of the through holes 342 is set to a preset dimension t1. In this example, a shape of each of the through holes 342 is circular. However, the shape of each of the through holes 342 may be other shapes. It is desired that the radial dimension t1 of each of the through holes 342 be equal to or smaller than one-twentieth of a wavelength $\lambda$ of electromagnetic noise, which is a target to be suppressed. The radial dimension t1 of each of the through holes 342 is adjusted in accordance with the wavelength $\lambda$ of the electromagnetic noise, which is the target to be suppressed. In other words, the radial dimension t1 of each of the through holes 342 is adjusted in accordance with a frequency of the electromagnetic noise, which is the target to be suppressed.

Figure 3:
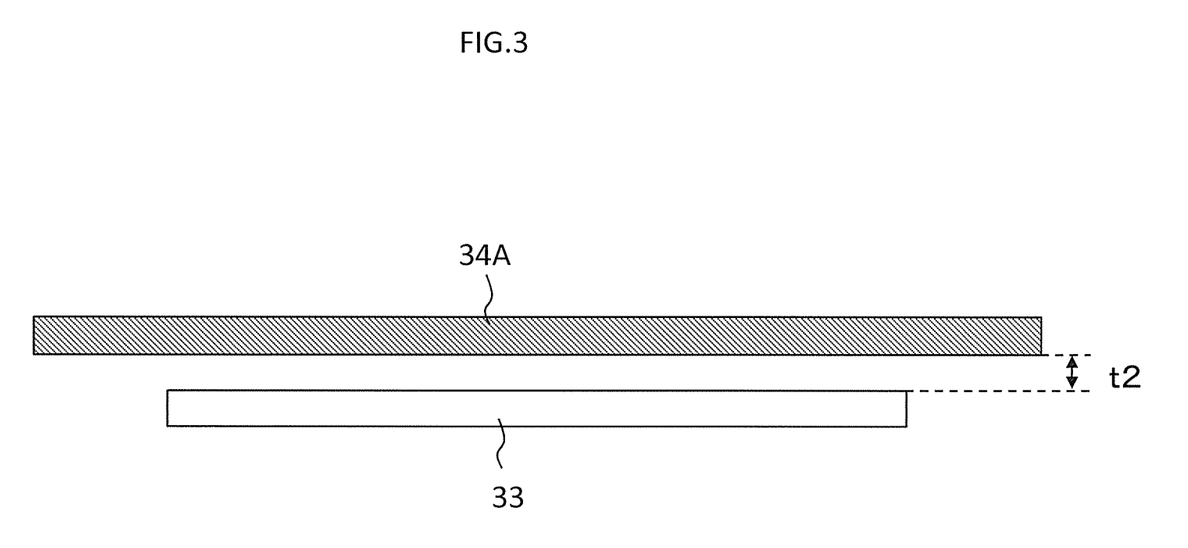
FIG. 3 is an enlarged view for illustrating a control circuit board and the metal shield plate of FIG. 1.

FIG. 3 is an enlarged view for illustrating the control circuit board 33 and the metal shield plate 34A of FIG. 1. The control circuit board 33 and the metal shield plate 34A are arranged in parallel to each other. A dimension between the control circuit board 33 and the metal shield plate 34A is set to a preset dimension t2. It is desired that the dimension t2 between the control circuit board 33 and the metal shield plate 34A be equal to or smaller than one-twentieth of the wavelength $\lambda$ of the electromagnetic noise, which is the target to be suppressed. The dimension t2 between the control circuit board 33 and the metal shield plate 34A is adjusted in accordance with the wavelength $\lambda$ of the electromagnetic noise, which is the target to be suppressed. In other words, the dimension t2 between the control circuit board 33 and the metal shield plate 34A is adjusted in accordance with the frequency of the electromagnetic noise, which is the target to be suppressed.

As described above, with the inverter-integrated rotating electric machine 1A according to the first embodiment of the present invention, propagation of the electromagnetic noise generated from the inverter device 3A to an outside of the inverter device 3A can be suppressed. Further, propagation of electromagnetic noise generated from a peripheral device for the inverter-integrated rotating electric machine 1A to an inside of the inverter device 3A can be suppressed. As a result, an influence of the electromagnetic noise between the peripheral device for the inverter-integrated rotating electric machine 1A and the control circuit board 33 can be suppressed, thereby being capable of improving resistance of the inverter-integrated rotating electric machine against the electromagnetic noise.

Further, the inverter 3A includes the resin portion 35 formed between the switching elements 31 and the control circuit board 33 and between the control circuit board 33 and the metal shield plate 34A. Thus, the reliability in terms of anti-vibration, water-proofness, and dust-proofness for the switching elements 31 and the control circuit board 33 can be improved.

Further, the through holes 342 into which the resin portion 35 in a liquid state is caused to flow are formed through the metal shield plate 34A. Thus, the switching elements 31, the control circuit board 33, and the metal shield plate 34A can easily be fixed.

Further, the dimension t1 of a diameter of each of the through holes 342 of the metal shield plate 34A is equal to or smaller than one-twentieth of the wavelength $\lambda$ of the electromagnetic noise, which is the target to be suppressed. Thus, passage of the electromagnetic noise through the through holes 342 can be suppressed.

Further, the metal shield plate 34A is electrically connected to the heat sink 32 with use of the screws 37. Thus, a potential of the metal shield plate 34A and a potential of the heat sink 32 can be set to the same potential.

Further, the metal shield plate 34A is formed of the electroconductive plate. Thus, the influence of the electromagnetic noise between the peripheral device for the inverter-integrated rotating electric machine 1A and the control circuit board 33 can be suppressed.

The dimension t2 between the metal shield plate 34A and the control circuit board 33 is equal to or smaller than one-twentieth of the wavelength λ of the electromagnetic noise, which is the target to be suppressed. Thus, the passage of the electromagnetic noise between the metal shield plate 34A and the control circuit board 33 can be suppressed.

The resin portion 35 is made of the epoxy resin or the gel-like resin. Thus, the reliability in terms of anti-vibration, water-proofness, and dust-proofness for the switching elements 31 and the control circuit board 33 can be improved.

In the first embodiment described above, propagation of the electromagnetic noise from the control circuit board 33 toward the bracket 22 of the rotating electric machine main body 2 is not described. However, the heat sink 32 has the same functions as those of the metal shield plate 34A.

Further, in the first embodiment described above, the number of through holes 341 into which the screws 37 configured to connect the metal shield plate 34A and the heat sink 32 to each other are inserted is set to four, and the number of screws 37 inserted into the through holes 341 is set to four. However, the numbers thereof may be other numbers. Further, the number of through holes 342 into which the resin of the resin portion 35 is caused to flow is set to five. However, the number thereof may be another number.

Second Embodiment

Figure 4:
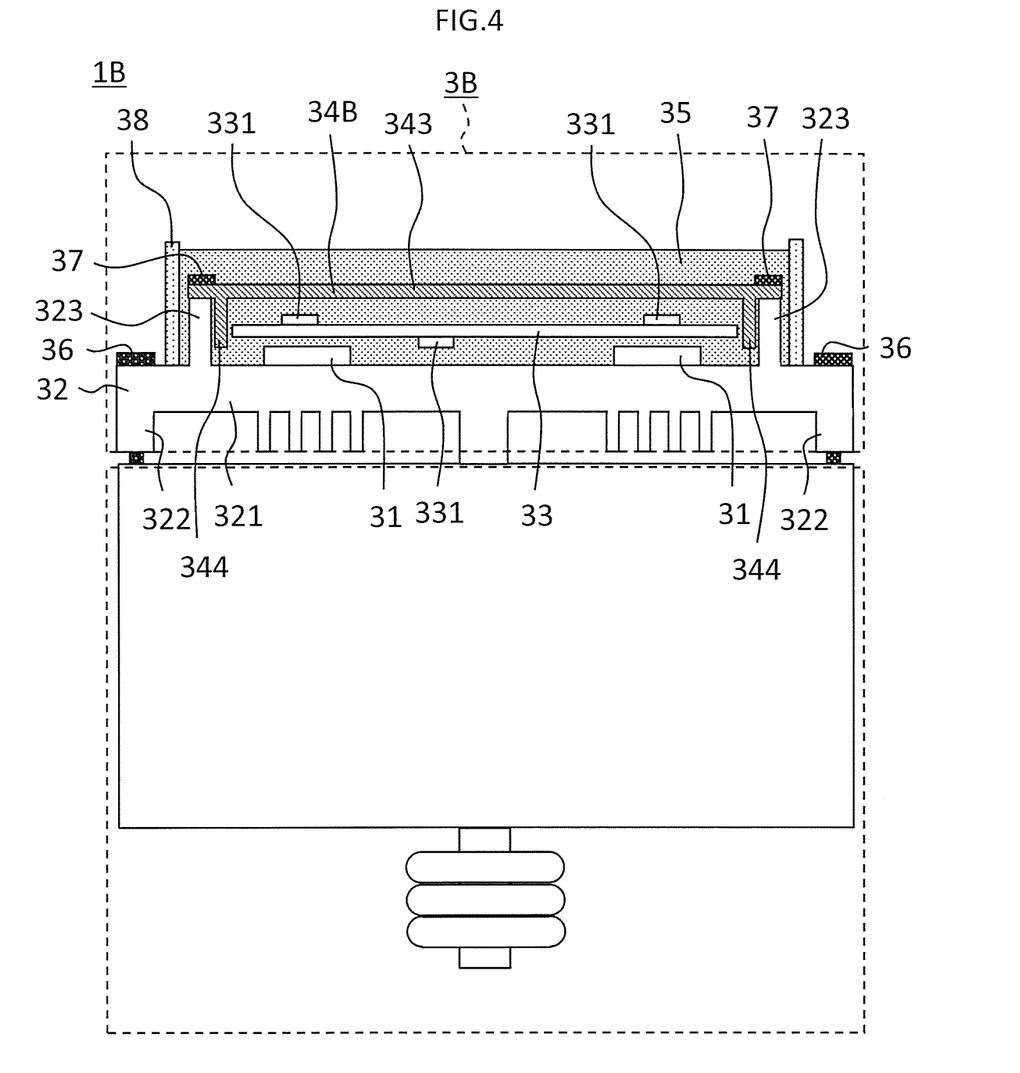
FIG. 4 is a configuration view for illustrating an inverter-integrated rotating electric machine according to a second embodiment of the present invention.

FIG. 4 is a configuration view for illustrating an inverter-integrated rotating electric machine according to a second embodiment of the present invention. An inverter-integrated rotating electric machine 1B includes a rotating electric machine main body 2 and an inverter device 3B provided to the rotating electric machine main body 2. The rotating electric machine main body 2 is the same as that in the first embodiment.

The inverter device 3B includes a plurality of switching elements 31, a heat sink 32, a control circuit board 33, a metal shield plate 34B, and a resin portion 35. The heat sink 32 is configured to cool the switching elements 31. The control circuit board 33 is provided so as to be opposed to the heat sink 32. The metal shield plate 34B is provided so as to be opposed to the control circuit board 33 in such a manner that the control circuit board 33 is arranged between the metal shield plate 34B and the heat sink 32, and is electrically connected to the heat sink 32. The resin portion 35 is formed between the switching elements 31 and the control circuit board 33 and between the control circuit board 33 and the metal shield plate 34B. The inverter device 3B is the same as the inverter device 3A of the first embodiment except for the metal shield plate 34B.

The metal shield plate 34B includes a shield-plate main body 343 and shield-plate side portions 344. The shield-plate main body 343 is opposed to the surface of the control circuit board 33, which is on the side opposite to the surface opposed to the heat sink 32. The shield-plate side portions 344 are provided to the shield-plate main body 343, and are opposed to side surfaces of the control circuit board 33. The shield-plate side portions 344 are arranged on an inner side of the projecting portions 323 in the in-plane direction.

Figure 5:
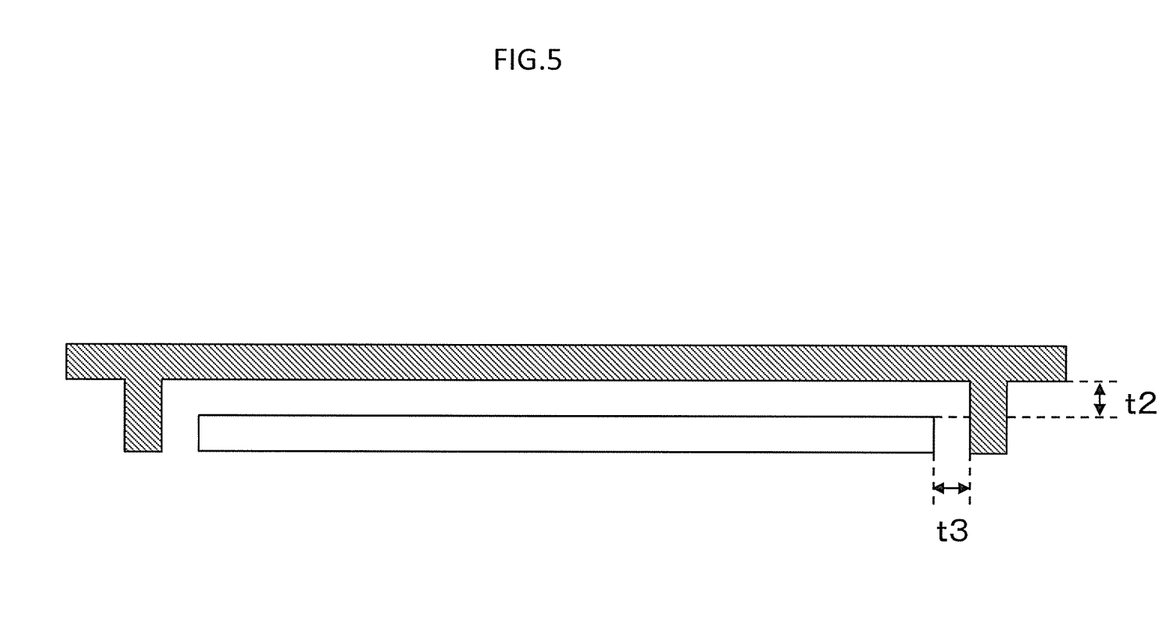
FIG. 5 is an enlarged view for illustrating a control circuit board and a metal shield plate of FIG. 4.

FIG. 5 is an enlarged view for illustrating the control circuit board 33 and the metal shield plate 34B of FIG. 4. The control circuit board 33 and the shield-plate main body 343 are arranged in parallel to each other. A dimension between the control circuit board 33 and the metal shield plate 34B is set to a preset dimension t2. It is desired that the dimension t2 between the control circuit board 33 and the shield-plate main body 343 be equal to or smaller than one-twentieth of the wavelength λ of the electromagnetic noise, which is the target to be suppressed. The dimension t2 between the control circuit board 33 and the shield-plate main body 343 is adjusted in accordance with the wavelength λ of the electromagnetic noise, which is the target to be suppressed. In other words, the dimension t2 between the control circuit board 33 and the shield-plate main body 343 is adjusted in accordance with the frequency of the electromagnetic noise, which is the target to be suppressed.

A dimension between the control circuit board 33 and each of the shield-plate side portions 344 is set to a preset dimension t3. It is desired that the dimension t3 between the control circuit board 33 and each of the shield-plate side portions 344 be equal to or smaller than one-twentieth of the wavelength λ of the electromagnetic noise, which is the target to be suppressed. The dimension t3 between the control circuit board 33 and each of the shield-plate side portions 344 is adjusted in accordance with the wavelength λ of the electromagnetic noise, which is the target to be suppressed. In other words, the dimension t3 between the control circuit board 33 and each of the shield-plate side portions 344 is adjusted in accordance with the frequency of the electromagnetic noise, which is the target to be suppressed.

The electromagnetic noise generated from the control circuit board 33 is radiated not only in an out-of-plane direction of the control circuit board 33 but also in the in-plane direction depending on a size of a slit portion being a space between the control circuit board 33 and the shield-plate main body 343. Further, the electromagnetic noise propagating toward the control circuit board 33 propagates not only in the out-of-plane direction of the control circuit board 33 but also in the in-plane direction thereof. The electromagnetic noise propagating in the in-plane direction is suppressed by the shield-plate side portions 344. Other configurations are the same as those in the first embodiment.

As described above, in the inverter-integrated rotating electric machine 1B according to the second embodiment of the present invention, the metal shield plate 34B includes the shield-plate main body 343 opposed to the surface of the control circuit board 33, which is on the side opposite to the surface opposed to the heat sink 32, and the shield-plate side portions 344 provided to the shield-plate main body 343 and opposed to the side surfaces of the control circuit board 33. Thus, the propagation of the electromagnetic noise to the control circuit board 33 in the out-of-plane direction and the in-plane direction can be suppressed. As a result, the influence of the electromagnetic noise between the peripheral device for the inverter-integrated rotating electric machine 1B and the control circuit board 33 can be further suppressed.

REFERENCE SIGNS LIST 1A, 1B inverter-integrated rotating electric machine, 2 rotating electric machine main body, 3A, 3B inverter device, 21 shaft, 22 bracket, 23 pulley, 31 switching element, 32 heat sink, 33 control circuit board, 34A, 34B metal shield plate, 35 resin portion, 36 screw, 37 screw, 38 case, 321 heat sink main body, 322 projecting portion, 323 projecting portion, 331 electronic component, 341 through hole, 342 through hole, 343 shield-plate main body, 344 shield-plate side portion.

The invention claimed is:

1. An inverter-integrated rotating electric machine, comprising:

a rotating electric machine main body; and an inverter device, which is provided to the rotating electric machine main body, and is configured to transmit and receive electric power to and from the rotating electric machine main body, wherein the inverter device includes: a heat sink configured to cool switching elements; a control circuit board, which is provided so as to be opposed to the heat sink, and includes a drive circuit configured to drive the switching elements; a metal shield plate, which is provided so as to be opposed to the control circuit board in such a manner that the control circuit board is arranged between the metal shield plate and the heat sink, and comprises an electrical connection to the heat sink, wherein the metal shield plate comprises a plurality of through holes, and a first diameter of the plurality of through holes is configured to be equal to or smaller than one-twentieth of a wavelength of an electromagnetic noise emitted by a device external to the inverter-integrated rotating electric machine; and a resin portion formed between the switching elements and the control circuit board and between the control circuit board and the metal shield plate, wherein the resin portion in a liquid state is caused to flow into the plurality of through holes.

2. The inverter-integrated rotating electric machine according to claim 1, wherein the resin portion is made of an epoxy resin or a gel-like resin.

3. The inverter-integrated rotating electric machine according to claim 1, wherein the metal shield plate includes:

a shield-plate main body opposed to a surface of the control circuit board, which is on a side opposite to a surface opposed to the heat sink; and shield-plate side portions provided to the shield-plate main body and opposed to side surfaces of the control circuit board, wherein the shield-plate side portions are configured to suppress a propagation of an electromagnetic noise to or from the control circuit board in an in-plane direction, with respect to a plane of the control circuit board.

4. The inverter-integrated rotating electric machine according to claim 1, wherein the metal shield plate is electrically connected to the heat sink with use of screws.

5. The inverter-integrated rotating electric machine according to claim 1, wherein the metal shield plate is formed of an electroconductive plate.

6. The inverter-integrated rotating electric machine according to claim 1, wherein a gap exists in a direction of a perpendicular line running from the metal shield plate to the control circuit board, and a dimension of the gap is equal to or smaller than one-twentieth of a wavelength of electromagnetic noise, which is a target to be suppressed.

7. The inverter-integrated rotating electric machine according to claim 1, wherein the plurality of through holes comprises five through holes, four through holes of the five through holes are arranged at respective corners of the metal shield plate and one of the five through holes is arranged at a center of the metal shield plate.

8. The inverter-integrated rotating electric machine according to claim 1, wherein a reliability of the control circuit board operation is improved by the control circuit board being protected by a shielding effect, the shielding effect based on the electrical connection of the metal shield plate to the heat sink and based on the first diameter configured based on the second wavelength of the second electromagnetic noise emitted by the external device.

9. The inverter-integrated rotating electric machine according to claim 1, wherein the metal shield plate includes a second plurality of screw holes characterized by a second diameter, and the second diameter is less than the first diameter.

10. The inverter-integrated rotating electric machine according to claim 1, wherein the resin is configured to improve the integrity of the switching elements and control board against water, dust and vibration.

11. An inverter-integrated rotating electric machine, comprising: a rotating electric machine main body; and an inverter device, which is provided to the rotating electric machine main body, and is configured to transmit and receive electric power to and from the rotating electric machine main body, wherein the inverter device includes: a heat sink configured to cool switching elements; a control circuit board, which is provided so as to be opposed to the heat sink, and includes a drive circuit configured to drive the switching elements; a metal shield plate, which is provided so as to be opposed to the control circuit board in such a manner that the control circuit board is arranged between the metal shield plate and the heat sink, and comprises an electrical connection to the heat sink, wherein the metal shield plate comprises a plurality of through holes having a first diameter; and a resin portion formed between the switching elements and the control circuit board and between the control circuit board and the metal shield plate, wherein the resin portion in a liquid state is caused to flow into the plurality of through holes, wherein the first diameter is less than the smaller of one twentieth of a first wavelength and one twentieth of a second wavelength, the first wavelength associated with a first electromagnetic noise generated by the inverter device and the second wavelength associated with a second electromagnetic noise generated by a device external to the inverter-integrated rotating electric machine.

* * * * *